US010070081B2

United States Patent
Mo et al.

(10) Patent No.: US 10,070,081 B2
(45) Date of Patent: Sep. 4, 2018

(54) STACKED IMAGE SENSOR PIXEL CELL WITH DYNAMIC RANGE ENHANCEMENT AND SELECTABLE SHUTTER MODES AND IN-PIXEL CDS

(71) Applicant: SmartSens Technology (U.S.), Inc., Shanghai (CN)

(72) Inventors: Yaowu Mo, Shanghai (CN); Chen Xu, Shanghai (CN); Zexu Shao, Shanghai (CN); Zhengmin Zhang, Shanghai (CN); Weijian Ma, Shanghai (CN)

(73) Assignee: SmartSens Technology (U.S.), Inc., Shanghai (CN)

( * ) Notice: Subject to any disclaimer, the term of this patent is extended or adjusted under 35 U.S.C. 154(b) by 0 days.

(21) Appl. No.: 15/678,438

(22) Filed: Aug. 16, 2017

(65) Prior Publication Data
US 2018/0227516 A1 Aug. 9, 2018

Related U.S. Application Data

(63) Continuation-in-part of application No. 15/424,124, filed on Feb. 3, 2017, now Pat. No. 9,992,437.

(51) Int. Cl.
*H04N 5/357* (2011.01)
*H04N 5/374* (2011.01)
(Continued)

(52) U.S. Cl.
CPC ....... *H04N 5/3575* (2013.01); *H01L 27/1469* (2013.01); *H01L 27/14605* (2013.01);
(Continued)

(58) Field of Classification Search
CPC .. H04N 5/374; H04N 5/378; H01L 27/14616; H01L 27/14629; H01L 27/14643
See application file for complete search history.

(56) References Cited

U.S. PATENT DOCUMENTS 6,731,335 B1 5/2004 Kim et al.
2005/0017315 A1* 1/2005 Hammadou ...... H01L 27/11803
257/431
(Continued)

OTHER PUBLICATIONS

Yannick De Wit, Tomas Geurts; Title: A Low Noise Low Power Global Shutter CMOS Pixel Having Capability and Good Shutter Efficiency; Date: Unknown; pp. 1-4; Pub: Belgium.

*Primary Examiner* — Abdelaaziz Tissire
(74) *Attorney, Agent, or Firm* — Eric Karich; Karich & Associates

(57) ABSTRACT

A pixel cell has a photodiode, a transfer transistor, a reset transistor, a dynamic range enhancement capacitor, a capacitor control transistor, an amplifier transistor in a source follower configuration and a rolling shutter row select transistor and a readout circuit block. The photodiode, a transfer transistor, a reset transistor, dynamic range enhancement capacitor, capacitor control transistor, amplifier transistor and rolling shutter row select transistor are disposed within a first substrate of a first semiconductor chip for accumulating an image charge in response to light incident upon the photodiode. The readout circuit block may be partially disposed within a second substrate of a second semiconductor chip and partially disposed within the first substrate wherein the readout circuit block comprises optionally selectable rolling shutter and global shutter readout modes through the use of computer programmable digital register settings. The global shutter readout mode provides in-pixel correlated double sampling.

9 Claims, 11 Drawing Sheets

(51) Int. Cl.
*H04N 5/378* (2011.01)
*H01L 27/146* (2006.01)
*H04N 5/3745* (2011.01)
*H04N 5/355* (2011.01)
*H04N 5/353* (2011.01)
*H04N 9/04* (2006.01)
*H04N 5/361* (2011.01)

(52) U.S. Cl.
CPC .. *H01L 27/14609* (2013.01); *H01L 27/14621* (2013.01); *H01L 27/14634* (2013.01); *H01L 27/14636* (2013.01); *H01L 27/14641* (2013.01); *H01L 27/14645* (2013.01); *H04N 5/3532* (2013.01); *H04N 5/3559* (2013.01); *H04N 5/361* (2013.01); *H04N 5/378* (2013.01); *H04N 5/3745* (2013.01); *H04N 9/045* (2013.01); *H04N 2209/045* (2013.01)

(56) References Cited

U.S. PATENT DOCUMENTS

| | | | | |
|---|---|---|---|---|
| 2007/0035649 A1* | 2/2007 | McKee | H01L 27/14609 | 348/308 |
| 2007/0085920 A1* | 4/2007 | Ying | H01L 27/14634 | 348/308 |
| 2013/0107093 A1* | 5/2013 | Aoki | H04N 5/3745 | 348/302 |
| 2013/0181316 A1* | 7/2013 | Tsukimura | H01L 31/02016 | 257/443 |
| 2013/0221470 A1* | 8/2013 | Kinsman | H01L 27/14618 | 257/434 |
| 2013/0314573 A1* | 11/2013 | Tsukimura | H04N 5/335 | 348/302 |
| 2014/0077063 A1* | 3/2014 | Cho | H01L 27/14618 | 250/208.1 |
| 2014/0094030 A1* | 4/2014 | Shimotsusa | H01L 21/768 | 438/652 |
| 2014/0139713 A1* | 5/2014 | Gomi | H01L 27/14618 | 348/308 |
| 2014/0176770 A1* | 6/2014 | Kondo | H01L 27/14634 | 348/294 |
| 2014/0211056 A1* | 7/2014 | Fan | H01L 27/14643 | 348/308 |
| 2014/0239152 A1* | 8/2014 | Chen | H01L 27/14605 | 250/208.1 |
| 2015/0341582 A1* | 11/2015 | Sakaguchi | H01L 27/14634 | 348/301 |
| 2016/0037111 A1* | 2/2016 | Dai | H04N 5/378 | 250/208.1 |
| 2016/0044265 A1* | 2/2016 | Kato | H04N 5/361 | 348/308 |
| 2016/0112665 A1* | 4/2016 | Meynants | H01L 27/14643 | 250/208.1 |
| 2017/0366764 A1* | 12/2017 | Innocent | H04N 5/353 | |

* cited by examiner

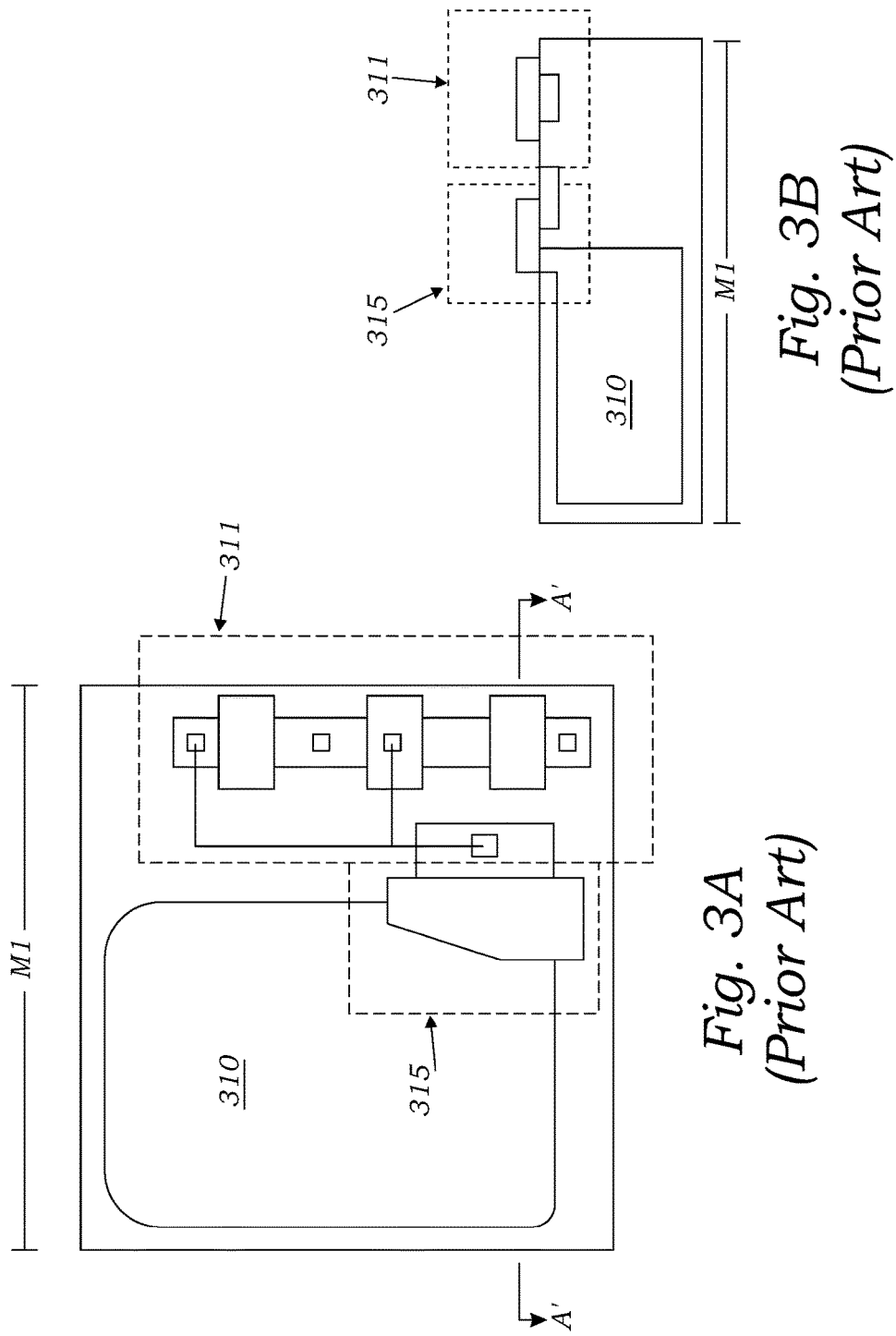

STACKED IMAGE SENSOR PIXEL CELL WITH DYNAMIC RANGE ENHANCEMENT AND SELECTABLE SHUTTER MODES AND IN-PIXEL CDS

CROSS-REFERENCE TO RELATED APPLICATIONS

This application for a utility patent is a continuation-in-part of a previously filed utility patent, still pending, having the application Ser. No. 15/424,124, filed 3 Feb. 2017.

BACKGROUND OF THE INVENTION

Field of the Invention

This invention relates generally to image sensors, and more particularly to CMOS image sensors in a stacked chip formation. The bottom chip includes an array of light sensitive regions and structures to capture an image. The top chip includes circuit elements to extract an image from the array. The image sensor may be incorporated within a digital camera.

Description of Related Art

An image capture device includes an image sensor and an imaging lens. The imaging lens focuses light onto the image sensor to form an image, and the image sensor converts the light into electrical signals. The electric signals are output from the image capture device to other components of a host electronic system. The image capture device and the other components of a host electronic system form an imaging system. Image sensors have become ubiquitous and may be found in a variety of electronic systems, for example a mobile device, a digital camera, a medical device, or a computer.

A typical image sensor comprises a number of light sensitive picture elements ("pixels") arranged in a two-dimensional array. Such an image sensor may be configured to produce a color image by forming a color filter array (CFA) over the pixels. The technology used to manufacture image sensors, and in particular, complementary metal-oxide-semiconductor ("CMOS") image sensors, has continued to advance at great pace. For example, the demands of higher resolution and lower power consumption have encouraged the further miniaturization and integration of these image sensors. However, miniaturization has come with the loss of pixel photosensitivity and dynamic range which require new approaches in order to mitigate.

With the decreased pixel size, the total light absorption depth within the substrate becomes insufficient for some light, especially long-wavelength light. This becomes a particular problem for image sensors using backside illumination (BSI) technology wherein the image light is incident upon the backside of the sensor substrate. In BSI technology the sensor Silicon substrate may be only two microns (micrometers) thick which is adequate to absorb blue light but very inadequate to absorb red light which may require ten microns of thickness to be fully absorbed.

It is known to form a given image sensor as a so-called stacked image sensor. In a typical arrangement of this type, photodiodes or other light sensitive elements of the pixel array are formed in a first semiconductor die or substrate, while associated readout circuitry for processing signals from the photosensitive elements is formed in a second semiconductor die or substrate that directly overlies the first semiconductor die or substrate. These first and second semiconductor die or substrates are more generally referred to herein as sensor and circuit chips, respectively. More precisely, the first and second semiconductor die are formed alongside many other like die on the first and second semiconductor wafers which are stacked, after aligning associated inter-wafer electrical interconnects, and diced or cut into a stacked assembly of commonly called semiconductor chips. When reference is made to stacking two chips it is understood that in common practice two wafers are stacked and diced into chips that remain stacked to form an electrical system such as a stacked image sensor. Also the inter-wafer electrical interconnects coupling the sensor and circuit wafers may be referred to as inter-chip interconnects while intra-wafer interconnects and intra-chip interconnects refer to interconnections formed among devices residing on the same wafer and chip respectively. An advantage associated with this arrangement includes that the resulting image sensor system occupies a reduced area compared with not stacked arrangements. An additional advantage is that different manufacturing methods and materials may be used to fabricate each chip allowing independent optimizations to be employed.

Two of the most common methods for reading off the image signals generated on a sensor chip are the rolling shutter mode and the global shutter mode. The rolling shutter mode involves exposing different lines of the sensor array at different times and reading out those lines in a chosen sequence. The global shutter mode involves exposing each pixel simultaneously and for the same length of time similar to how a mechanical shutter operates on a legacy "snapshot" camera. Prior art digital imaging systems have utilized either rolling shutter or global shutter readout modes. There are advantages however to having an imaging system which is capable of both readout modes wherein the readout mode is selectable by the operator.

Rolling shutter (RS) mode exposes and reads out adjacent rows of the array at different times, that is, each row will start and end its exposure slightly offset in time from its neighbor. The readout of each row follows along each row after the exposure has been completed and transfers the charge from each row into the readout node of the pixel. Although each row is subject to the same exposure time, the row at the top will have ended its exposure a certain time prior to the end of the exposure of the bottom row of the sensor. That time depends on the number of rows and the offset in time between adjacent rows. A potential disadvantage of rolling shutter readout mode is spatial distortion which results from the above. The distortion becomes more apparent in cases where larger objects are moving at a rate that is faster than the readout rate. Another disadvantage is that different regions of the exposed image will not be precisely correlated in time and appear as a distortion in the image. To improve signal to noise in the image signal final readout, specifically to reduce temporal dark noise, a reference readout called correlated double sampling (CDS) is performed prior to the conversion of each pixel charge to an output signal by an amplifier transistor. The amplifier transistor may typically be a transistor in a source-follower (SF) or common drain configuration wherein the pixel employs a voltage mode readout. However, there are advantages to incorporating a common source amplifier wherein the pixel employs a current mode readout. The common source amplifier may be used in large area imagers. The current of the photodiode is amplified and the readout circuits integrate the current on a capacitor to a voltage, which is then converted to the digital domain.

Global shutter (GS) mode exposes all pixels of the array simultaneously. This facilitates the capture of fast moving events, freezing them in time. Before the exposure begins all the pixels are reset (RST) to the same ostensibly dark level by draining all their charge. At the start of the exposure each pixel begins simultaneously to collect charge and is allowed to do so for the duration of the exposure time. At the end of the exposure each pixel transfers charge simultaneously to its readout node. Global shutter mode can be configured to operate in a continuous manner whereby an exposure can proceed while the previous exposure is being readout from the readout storage nodes of each pixel. In this mode the sensor has 100% duty cycle which optimizes time resolution and photon collection efficiency. There is no artifact in the image of the period of transient readout that occurs in rolling shutter mode. Global shutter can be regarded as essential when exact time correlation is required between different regions of the sensor area. Global shutter is also very simple to synchronize with light sources or other devices.

Global shutter mode demands that a pixel contain at least one more transistor or storage component than a pixel using rolling shutter mode. Those extra components are used to store the image charge for readout during the time period following simultaneous exposure. Again in order to improve signal to noise in the image signal a reference readout is required not only to be performed prior to the conversion of each pixel charge to an output signal by an amplifier transistor but also prior to the transfer of the pixel charge to the extra components of the pixel used to store the image charge during readout.

In summary, rolling shutter can deliver the lowest read noise and is useful for very fast streaming of data without synchronization to light sources or peripheral devices. However it carries risk of spatial distortion especially when imaging relatively large, fast moving objects. There is no risk of spatial distortion when using global shutter and when synchronizing to fast switching peripheral devices it is relatively simple and can result in faster frame rates. Flexibility to offer both rolling shutter and global shutter can be very advantageous.

An opportunity for improvement of stacked image sensors in which the sensor and circuit chips are interconnected at each pixel element arises when certain novel circuit elements are employed to enable optionally selectable rolling shutter and global shutter readout modes. Another opportunity for improvement of stacked image sensors arises when certain components are employed on the sensor chip to enhance its ability to adequately image both high lights and dark shadows in a scene. The present invention fulfills these needs and provides further advantages as described in the following summary.

SUMMARY OF THE INVENTION

The present invention teaches certain benefits in construction and use which give rise to the objectives described below.

A pixel cell has a photodiode, a transfer transistor, a reset transistor, a dynamic range enhancement capacitor, capacitor control transistor, a source follower amplifier and a readout circuit block. The photodiode, transfer transistor, reset transistor, dynamic range enhancement capacitor, capacitor control transistor, and source follower amplifier are disposed within a first substrate of a first semiconductor chip for accumulating an image charge in response to light incident upon the photodiode. The readout circuit block may be partially disposed within a second substrate of a second semiconductor chip and partially disposed within the first substrate wherein the readout circuit block comprises optionally selectable rolling shutter and global shutter readout modes through the use of computer programmable digital register settings. The global shutter readout mode provides in-pixel correlated double sampling.

A primary objective of the present invention is to provide an image sensor pixel having advantages not taught by the prior art.

Another objective is to provide a pixel cell that occupies less area and may thereby reduce pixel array size and manufacturing cost.

An additional objective of the present is to provide a stacked pixel having readout modes selectable between rolling shutter and global shutter through the use of computer programmable digital register settings.

Another objective of the present invention is to provide a stacked pixel with optionally selectable readout modes and in-pixel correlated double sampling within a global shutter readout path.

Another objective of the present invention is to provide a stacked pixel wherein a rolling shutter signal is output on a sensor chip portion while a global shutter signal is output on a logic portion of the stacked pixel.

A further objective of the present invention is to provide a stacked pixel wherein a dynamic range enhancement capacitor and a capacitor control transistor are employed on the sensor chip in order to enhance signal dynamic range.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings:

FIG. 3A is a diagram illustrating a prior art pixel cell layout wherein photodiode, transfer transistor, and amplifier transistor occupy the same semiconductor wafer or chip;

FIG. 3B is a cross section diagram of the prior art pixel cell shown in FIG. 3A;

DETAILED DESCRIPTION OF THE INVENTION

The above-described drawing figures illustrate the invention, a stacked image sensor pixel cell with signal dynamic range enhancement components and optionally selectable rolling shutter and global shutter readout modes and in-pixel CDS in the global shutter readout path. Various embodiments of the stacked image sensor are disclosed herein. In the following description, numerous specific details are set forth in order to provide a thorough understanding of the present invention. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects. A substrate may have a front side and a back side. Any fabrication process that is performed from the front side may be referred to as a frontside process while any fabrication process that is performed from the back side may be referred to as a backside process. Structures and devices such as photodiodes and associated transistors may be formed in a front surface of a substrate. A dielectric stack that includes alternating layers of metal routing layers and conductive via layers may be formed on the front surface of a substrate.

The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly coupled by way of a metal line, or indirectly connected by way of an intervening circuit element (e.g., a capacitor, resistor, or by way of the source/drain terminals of a transistor). In the present invention of a stacked chip arrangement the front sides of two chips may be directly connected since the electrical interconnects on each chip will most commonly be formed on the front sides of each chip. When reference is made to certain circuit elements residing within or formed in a substrate this is generally accepted to mean the circuits reside on the front side of the substrate.

Figure 1:
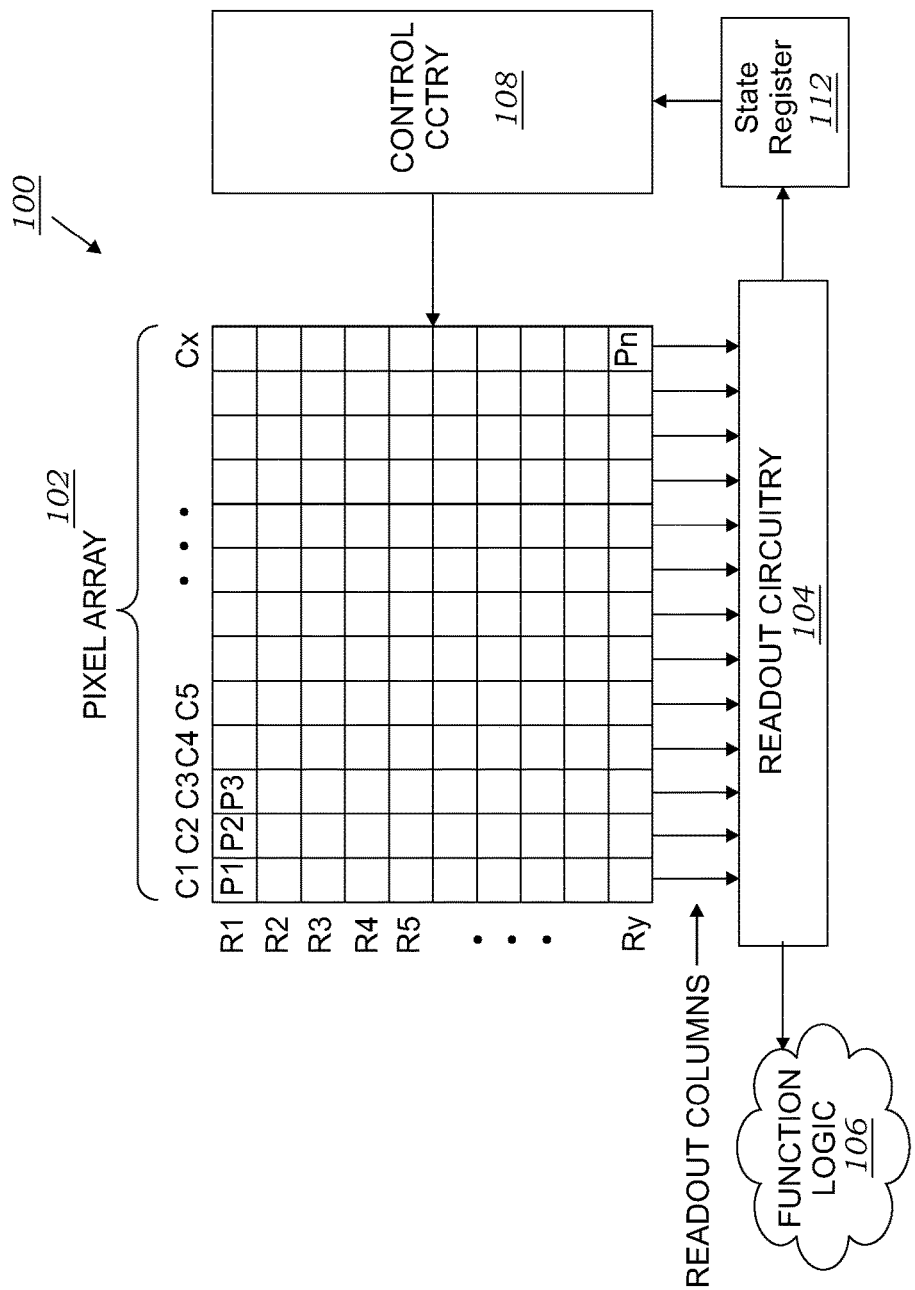
FIG. 1 is a diagram illustrating one example of an imaging system including a pixel array having stacked image sensor pixel cells included in an integrated circuit system according to one embodiment of the present invention.

FIG. 1 is a diagram illustrating one example of an imaging system 100 including an example pixel array 102 having a plurality of image sensor pixels included in an example integrated circuit system with features in accordance with the teachings of the present invention. As shown in the depicted example, imaging system 100 includes pixel array 102 coupled to control circuitry 108 and readout circuitry 104, which is coupled to function logic 106. Control circuitry 108 and readout circuitry 104 are in addition coupled to state register 110. In one example, pixel array 102 is a two-dimensional (2D) array of image sensor pixels (e.g., pixels P1, P2 . . . , Pn). As illustrated, each pixel is arranged into a row (e.g., rows R1 to Ry) and a column (e.g., column C1 to Cx) to acquire image data of a person, place, object, etc., which can then be used to render a 2D image of the person, place, object, etc. In one example, after each pixel has acquired its image data or image charge, the image data is readout by readout circuitry 104 using a readout mode specified by state register 110 and then transferred to function logic 106. In various examples, readout circuitry 104 may include amplification circuitry, analog-to-digital (ADC) conversion circuitry, or otherwise.

State register 110 may include a digitally programmed selection system to determine whether readout mode is by rolling shutter or global shutter. Function logic 106 may simply store the image data or even manipulate the image data by applying post image effects (e.g., crop, rotate, remove red eye, adjust brightness, adjust contrast, or otherwise). In one example, readout circuitry 104 may readout a row of image data at a time along readout column lines (illustrated) or may readout the image data using a variety of other techniques (not illustrated), such as a serial readout or a full parallel readout of all pixels simultaneously. In one example, control circuitry 108 is coupled to pixel array 102 to control operational characteristics of pixel array 102. Some aspects of the operation of control circuitry 108 may be determined by settings present in state register 110. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

Figure 2:
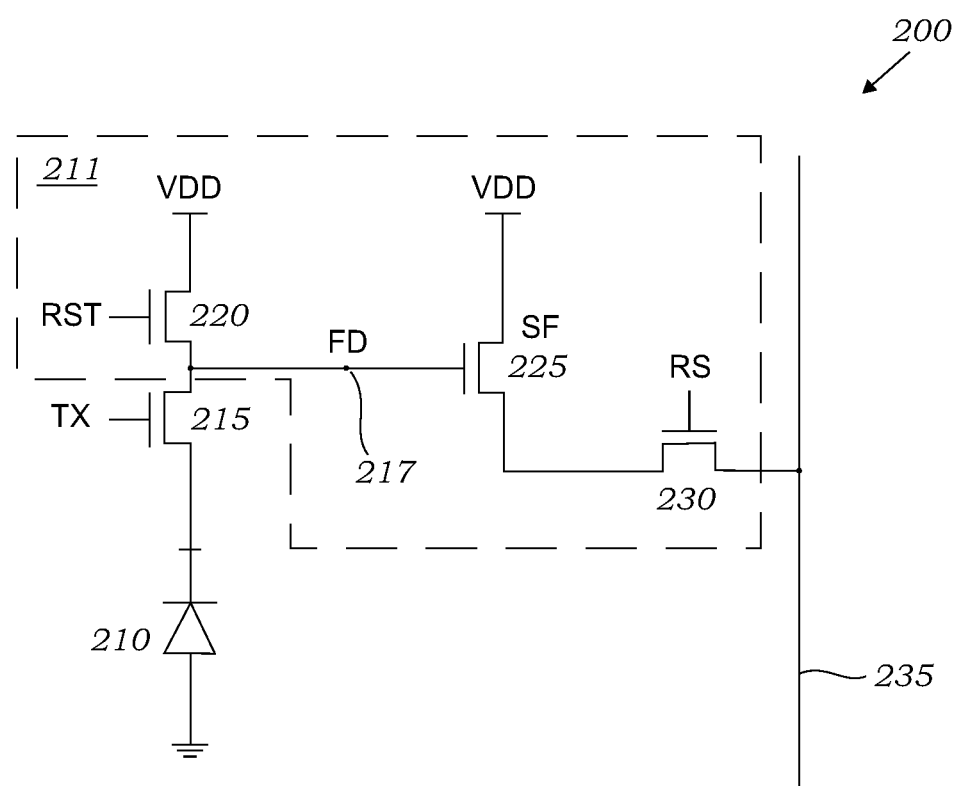
FIG. 2 is an electrical schematic that illustrates one example of a stacked image sensor pixel cell with rolling shutter readout found in the prior art.

FIG. 2 is an electrical schematic that illustrates one example of a stacked image sensor pixel cell with rolling shutter readout found in the prior art. This figure and example pixel are provided to simplify explanation of pixel operation in anticipation of a description of an example of the present invention. Each sensor pixel 200 includes a photodiode 210 (e.g., photosensitive element) and pixel support circuitry 211 as shown. Photodiode 210 may be a "pinned" photodiode as is commonly present in CMOS image sensors. Photodiode 210 may be disposed on a sensor chip of a stacked die system, while pixel support circuitry 211 may be disposed on a separate circuit chip. In one example, pixel support circuitry 211 includes a reset transistor 220, source follower (SF) amplifier transistor 225, and row select transistor 230 on a circuit chip coupled to a transfer transistor 215 and photodiode 210 on a sensor chip of a stacked die system as shown. In another example, not shown, pixel support circuitry includes row select transistor 230 on a circuit chip coupled to a reset transistor 220, source follower (SF) transistor 225, transfer transistor 215 and photodiode 210 on a sensor chip of a stacked die system. During operation, photosensitive element 210 photo-generates charge in response to incident light during an exposure period. Transfer transistor 215 is coupled to receive a transfer signal TX, which causes transfer transistor 215 to transfer the charge accumulated in photodiode 210 to floating diffusion (FD) node 217. Floating diffusion 217 is in effect the drain of the transfer transistor while the photodiode is the source of transfer transistor 215. In one embodiment transfer transistor is a metal-oxide semiconductor field-effect transistor (MOSFET). Reset transistor 220 is coupled between power rail VDD and floating diffusion node 217 to reset sensor pixel 200 (e.g., discharge or charge floating diffusion node 217 and photodiode 210 to a preset voltage) in response to a reset signal RST. Floating diffusion node 217 is coupled to control the gate terminal of source-follower transistor 225. Source-follower transistor 225 is coupled between power rail VDD and row select transistor 230 to amplify a signal responsive to the charge on the floating diffusion FD node 217. Row select transistor 230 couples the output of pixel circuitry from the source-follower transistor 225 to the readout column, or bit line 235, in response to a row select signal RS. Photodiode 210 and floating diffusion node 217 are reset by temporarily asserting the reset signal RST and transfer signal TX. The accumulating window (e.g., exposure period) begins when the transfer signal TX is de-asserted, which permits incident light to photo-generate charge in photodiode 210. As photo-generated electrons accumulate in photodiode 210, its voltage decreases (electrons are negative charge carriers). The voltage or charge on photodiode 210 is representative of the intensity of the light incident on photodiode 210 during the exposure period. At the end of the exposure period, the reset signal RST is de-asserted, which turns off the reset transistor 220 and isolates floating diffusion FD node 217 from VDD. The transfer signal TX is then asserted to couple photodiode 210 to floating diffusion node 217. The charge is transferred from photodiode 210 to the floating diffusion FD node 217 through transfer transistor 215, which causes the voltage of floating diffusion FD node 217 to drop by an amount proportional to photo-generated electrons accumulated on photodiode 210 during the exposure period.

An important design metric in image sensors is dynamic range, which is defined as the logarithmic ratio between the largest non-saturating photocurrent and the smallest detectable photocurrent. For a sensor with a fixed saturation charge, also referred to as well capacity, saturation limits the highest signal. Generally, the smallest detectable photocurrent is dominated by reset sampling noise of the photodiode and the floating diffusion. Efforts to reduce the impact of reset sampling noise on dynamic range have relied on correlated double sampling (CDS). CDS is a technique of taking two samples of a signal out of the pixel and subtracting the first from the second to remove reset sampling noise. Generally, the sampling is performed once immediately following reset of the photodiode and floating diffusion and once after the photodiode has been allowed to accumulate charge and transfer it to the floating diffusion. The subtraction is typically performed in peripheral circuitry outside of the pixel and may increase conventional image sensor area although it may not increase pixel area. An image sensor utilizing a rolling shutter readout mode may incorporate CDS with only added peripheral circuit elements and no additional circuit elements in the pixel. An image sensor utilizing global shutter however may require multiple capacitors and transistors inside the pixel which decreases the fill factor. It is advantageous to maintain reduced fill factor by partitioning the additional components required for CDS on to a circuit chip separate from and stacked on top of a sensor chip.

FIG. 3A is a diagram illustrating a common pixel cell layout in the prior art wherein photodiode 310, transfer transistor 315, and photodiode 310 occupy the same semiconductor wafer or chip. FIG. 3B is a cross section diagram of the pixel cell shown in FIG. 3A along its cross section line AA'. Photodiode 310 and pixel circuitry 311 correspond in kind to the photodiode and pixel circuitry denoted as photodiode 210 and pixel circuitry 211 in FIG. 2 except that they occupy the same wafer of chip. Transfer transistor 315 occupies the same location electrically as does transfer transistor 215 in FIG. 2 except that transfer transistor 315 is a commonly understood planar complementary metal-oxide semiconductor field-effect transistor (CMOSFET) wherein its source, channel, and drain components are located within the semiconductor substrate and parallel to the surface of the semiconductor substrate. It is advantageous for die dimension M1, as illustrated in FIGS. 3A and 3B to be as small as possible in order to reduce pixel array size and manufacturing cost. However die dimension M1 is limited by required minimum design rules of a manufacturing technology generation which set the closest approach of for example pixel circuitry 311 to transfer transistor 315. This situation is among the factors that drove the separation of pixel cells into two stacked chips where the pixel circuitry can be stacked over the photodiode and transfer transistor to result in a reduction of die dimension M1.

Figures 4A, 4B:
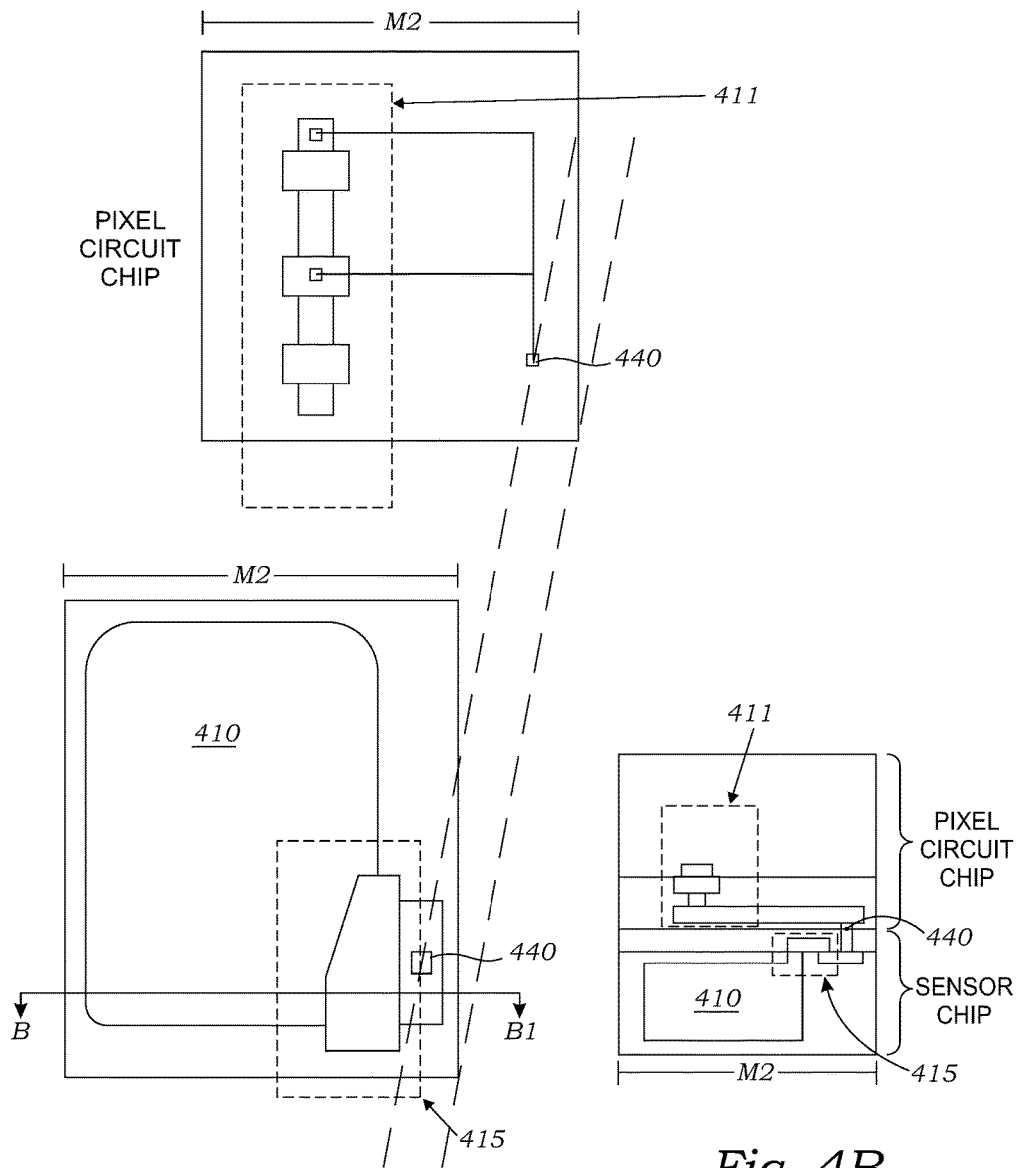
FIG. 4A is an exploded view diagram illustrating a prior art pixel cell layout.
FIG. 4B is a cross section diagram of the prior art pixel cell shown in FIG. 4A.

FIG. 4A is an exploded view diagram illustrating a common pixel cell layout in the prior art wherein photodiode 410 and planar CMOSFET transfer transistor 415 are located on the semiconductor substrate of a sensor wafer of chip and pixel circuitry 411 is located on a separate substrate of a circuit semiconductor wafer or chip. FIG. 4A shows an exploded view of a sensor chip and its components positioned on its upper surface aligned, to a circuit chip with its components positioned on its underside, at inter-chip interconnect 440. In the case of FIG. 4B the underside of the circuit chip is actually the frontside of its substrate as frontside has been previously herein defined. FIG. 4B is a cross section diagram of the pixel cell shown in FIG. 4A along its cross section line BB' including the overlying portion of the circuit chip. FIG. 4B illustrates the two stacked semiconductor chips are electrically coupled by inter-chip interconnect 440. Comparing FIG. 3A and FIG. 4A one skilled in the art will appreciate that, assuming photodiodes 310 and 410 have the same dimensions, die dimension M2 is smaller than dimension M1 thus providing an opportunity for manufacturing cost reduction.

In the stacked assembly illustrated in FIG. 4A and FIG. 4B the limiting die dimension is determined by the sensor chip. Assuming it is desired to retain the dimensions of the photodiode, one opportunity for further reduction to die dimension is to reduce the transfer transistor size or relocate it within the footprint of the photodiode.

In advanced image sensors the use of noise reduction methods may not be adequate to increase dynamic range enough to capture a typical outdoor scene where both bright sun light and dark shadows exist. An advanced dynamic range enhancement technique may employ a well capacity adjusting scheme. In this scheme, the well capacity is increased one or more times during the time period in which the photodiode charge is being transferred to the floating diode. The employment of such a dynamic range enhancement scheme in the context of a small area stacked image sensor pixel is a key element of the invention described herein. The dynamic range enhancement scheme employed in the embodiments of the invention involves constructing a well capacity adjusting circuit by adding a capacitor and a capacitor control transistor in an electrically parallel configuration with the floating drain on the sensor chip. By coupling the additional capacitor to the floating drain the photodiode charge is transferred to a larger capacitance resulting in a lower conversion gain and the ability to accommodate more charge before saturation. This ability is employed while scenes with high light intensity are being imaged and not while scenes with normal and low light intensity are being imaged. Therefore a required feature of such a scheme is the addition of a capacitor control transistor and an off pixel capacitor control transistor control signal circuit to sense the light intensity of the imaged scene. Various methods and constructions to sense the light intensity of a scene and based thereon signal appropriate control circuitry to apply the desired signal to a signal enhancement capacitor control transistor gate electrode are known to those skilled in the art and are not described herein.

Figure 5:
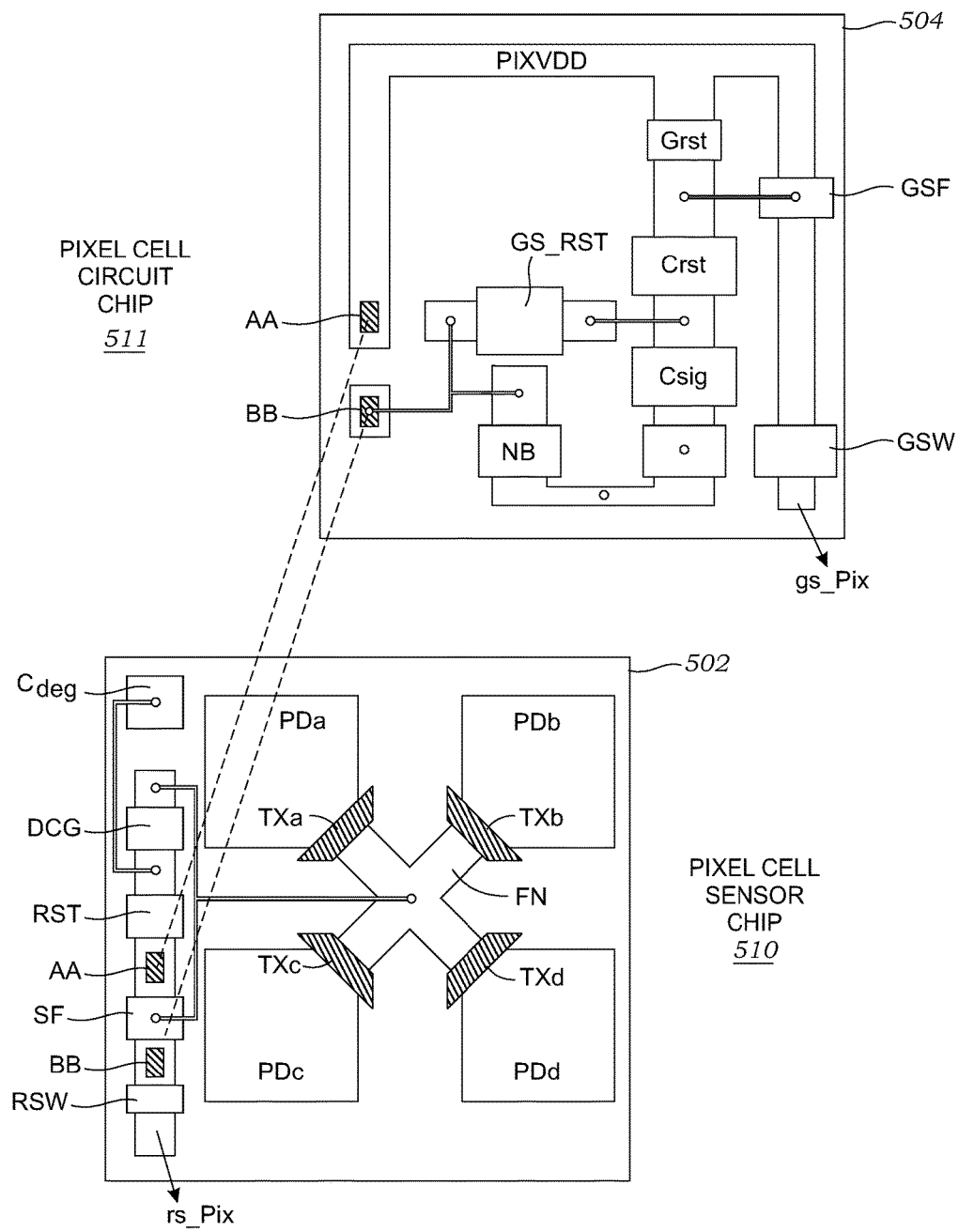
FIG. 5 is an exploded view diagram of a pixel cell in accordance with a first embodiment of the invention.

FIG. 5 is an exploded view diagram of a pixel cell in accordance with a first embodiment of the invention. FIG. 5 illustrates a pixel cell layout wherein pixel cell portion 502 includes photodiodes PDa, PDb, PDc, PDd and respective MOSFET transfer transistors Txa, TXb, TXc, TXd and commonly coupled floating drain FN located on the semiconductor substrate of a sensor wafer or chip 510. Pixel cell portion 502 also includes reset transistor RST and amplifier transistor SF and dynamic range enhancement capacitor Cdcg and capacitor control transistor DCG disposed within the sensor chip for converting the image charge to an image signal and for coupling the image signal out of the sensor chip through row select transistor RSW when a rolling shutter readout mode is selected. FIG. 5 also illustrates pixel cell portion 504 (pixel circuit chip) comprising pixel circuitry located on a separate semiconductor substrate of a circuit wafer or chip 511. FIG. 5 shows an exploded view of sensor chip 510 and its components positioned on its upper surface aligned at inter-chip interconnects AA and BB to circuit chip 511 with its components positioned on its underside, or as herein previously defined its front side. A figure not provided but may be easily imagined would be similar to FIG. 4B and would illustrate the two stacked semiconductor chips shown in FIG. 5 electrically coupled by inter-chip interconnects AA and BB.

Pixel cell portion 502 illustrates only the pixel related components residing on sensor wafer 510. Pixel cell portion 502 is repeated to form the rows and columns of an imaging array. Sensor chip 510 may contain additional peripheral circuits as need to functionalize the imaging array portion of the image sensor, for example, electrical wiring to carry reset and transfer transistor gate electrode control signals to all the pixel cells. Photodiodes PDa, PDb, PDc, and PDd may be of an identical size and positioned for example in a two by two array as shown. Typically the sizes and placements of the photodiodes within pixel cell portion 502 are chosen such that an array of pixel cell portions 502 will result in all of the photodiodes of the assembled array falling on a uniform grid. In the instance pixel cell 502 is employed to form a color image sensor, light filters of various colors may be placed at each pixel location within the incident light path. A commonly known two by two arrangement of light filters is a Bayer filter pattern which consists of a red, a blue and two green filters (RGGB). Pixel circuitry residing on pixel cell portion 504 is constrained to occupy no more area than that occupied by pixel cell portion 502. As illustrated in FIG. 5A pixel cell portion 504 (pixel circuit chip) includes readout circuitry capable of providing a global shutter readout function when a global shutter readout mode is selected. Pixel circuit chip 511 may contain additional peripheral circuits as need to functionalize the pixel circuitry portion of the image sensor, for example, electrical wiring to carry control signals and power.

Figure 6:
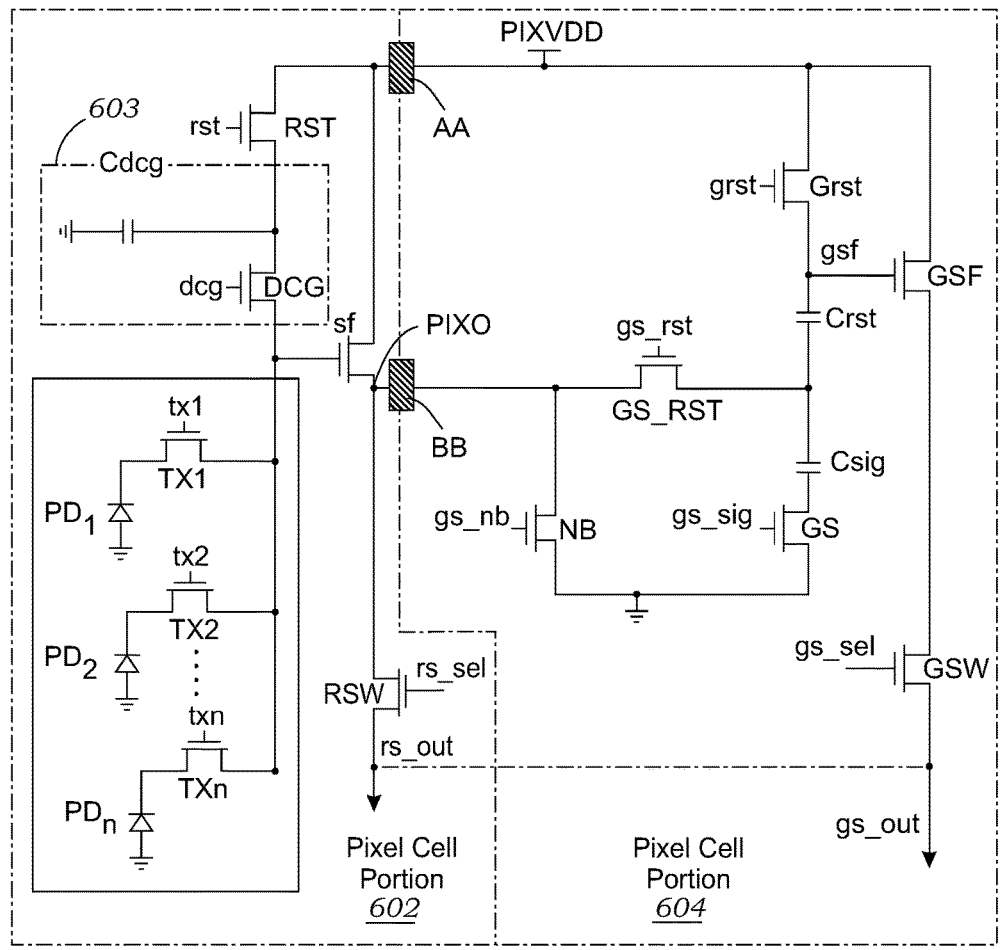
FIG. 6 is an electrical schematic diagram of the pixel cell illustrated in FIG. 5 and in accordance with a first embodiment of the invention.

FIG. 6 is an electrical schematic diagram of the pixel cell illustrated in FIG. 5 and in accordance with a first embodiment of the invention. Pixel cell portions 602 and 604 of FIG. 6 correspond to pixel cell portions 502 and 504 shown in FIG. 5. The electrical schematic diagram shown in FIG. 6 more clearly illustrates the electrical connections between the electrical components. The component names are in most cases common in both figures and will be used in the description of the operation of the pixel cell. FIG. 6 depicts a set of transfer transistors (TX1, TX2, TX3, TXn), each coupled to respective photodiodes (PD1, PD2, PD3, PDn) and sharing floating drains (FN), denoted as pixel cell portion 602 and disposed within a first substrate for accumulating and transferring an image charge in response to light incident upon the photodiodes. In FIG. 6 the photodiodes and their respective transfer transistors are listed as units 1, 2, and n (where n is a number larger than 2) rather than a, b, c, and d as in FIG. 5. This is to highlight that this circuit and the invention is applicable to any number of photodiode and transfer transistor pairs and not only the four such pairs illustrated in FIG. 5. Also residing on pixel cell portion 602 and disposed within the first substrate are a reset transistor (RST) and amplifier transistor SF for converting the image charge to an image signal (PIXO) and a row select transistor (RSW) for coupling the image signal out of pixel cell portion 602 when a rolling shutter readout mode is selected. Also residing on pixel cell portion 602 are dynamic range enhancement capacitor Cdcg and capacitor control transistor DCG which are useful to provide a dynamic range enhancement mode during the imaging of high light intensity scenes. FIG. 6 also depicts a readout circuit block denoted pixel cell portion 604 and disposed within a second substrate stacked upon the front surface of the first substrate, wherein the readout circuit block comprises an optionally selectable global shutter readout mode. Also shown in FIG. 6 are inter-chip electrical interconnects AA and BB which directly couple amplifier transistor SF to the global shutter readout circuit block. Inter-chip electrical interconnect BB couples image signal PIXO, which is generated at the source of source follower transistor amplifier SF, to global shutter readout circuit paths within pixel portion 604 on the second substrate. Inter-chip electrical interconnect AA couples power source PIXVDD to reset transistor RST and amplifier transistor SF.

One key inventive element of the present invention providing an advantage over the prior art is the invented pixel cell construction denoted by 603 whereby the image charge is partially stored on dynamic range enhancement capacitor Cdcg through capacitor control transistor DCG when the scene being imaged is a high light intensity scene. Dynamic range enhancement capacitor Cdcg, which is coupled between ground and the joining point of reset transistor RST and capacitor control transistor DCG, may be a MOS capacitor wherein excellent pixel output voltage linearity is provided or a diode capacitor for charge integration.

One additional key inventive element of the present invention providing an advantage over the prior art is the invented pixel cell construction whereby the image signal may be read out optionally in a rolling shutter readout mode through circuits residing only on the first substrate or optionally in a global shutter readout mode through circuits including those on the second substrate. Having the capability to produce an image with rolling shutter output without requiring the signal to traverse the second substrate may have advantages with respect to reduced power consumption and signal to noise and increased frame rate. To further separate the second substrate circuits from the first substrate circuits it may also be advantageous to provide power source PIXVDD from an optional source disposed solely on the first substrate.

Figure 7:
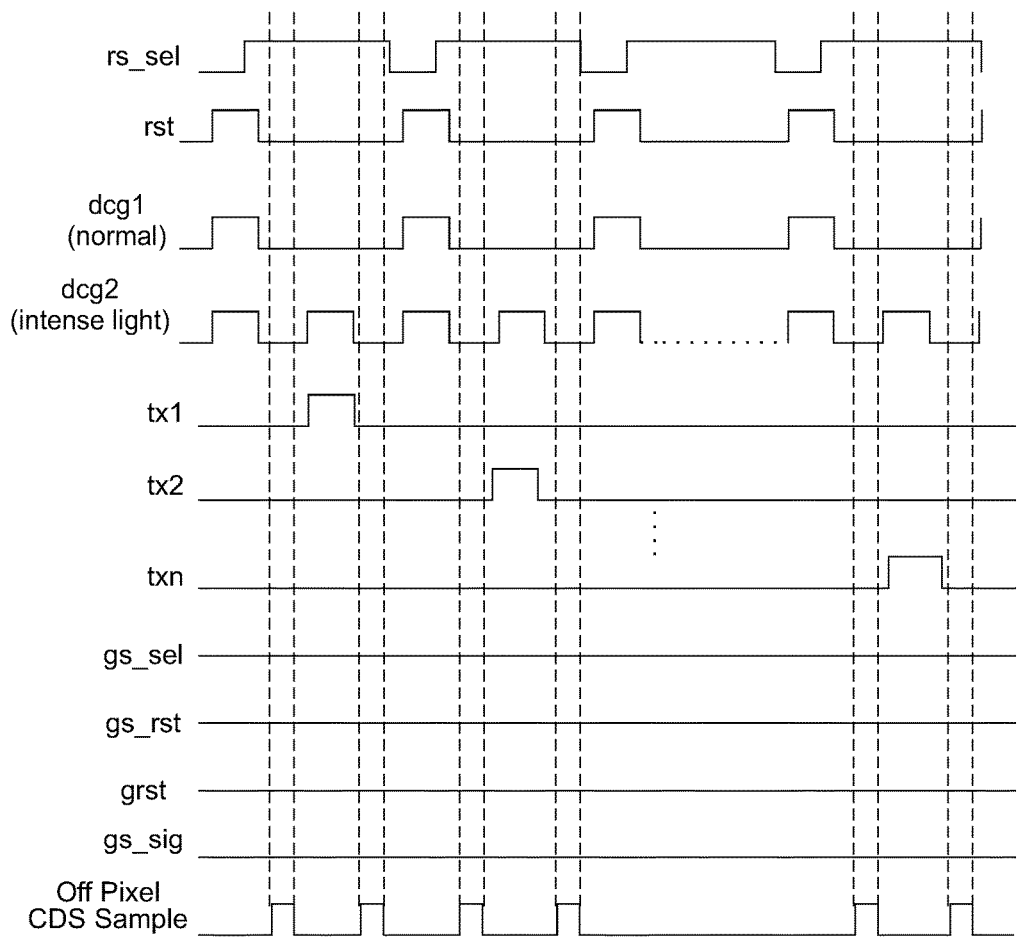
FIG. 7 is a control timing diagram illustrating control signal timing that may be used to execute a selected readout mode of the pixel cell illustrated in FIG. 5 and in accordance with a first embodiment of the invention.

In order to read out image signal PIXO in rolling shutter mode only row select transistor RSW is required to transfer read signal rs_pix to off-pixel readout circuits. Therefore upon selection of rolling shutter mode, by a suitable setting on state register 110 shown in FIG. 1, control circuitry 108 will cause at least transistors GS_RST, Grst, GSF, NB, and GSW shown in FIG. 6 to be turned off. FIG. 7 illustrates control timing that may be used to execute a rolling shutter mode readout of image signal PIXO from pixel cell portion 602. Each control signal shown in FIG. 7 corresponds to the similarly named signals applied to the gate electrodes of related transistors shown in FIG. 6 and their relative state of on (high) or off (low) is also shown. There are two charge integration modes depicted here. One for imaging a scene with low to normal light intensity wherein signal dcg1 is employed and a second for imaging a scene with high light intensity wherein signal dcg2 is employed. To execute a rolling shutter readout of image signal PIXO from cell portion 602 when a low to normal light intensity scene is to be imaged the following sequence as shown in FIG. 7 may be employed. First all signals are in the off state. Next the reset control signal rst on reset transistor RST and the control signal dcg on capacitor control transistor DCG are set high, which pulls floating drain node FN to an initial voltage VFN0 (close to PIXVDD) and also pulls the source of amplifier SF to an image signal PIXO(rst) corresponding to initial voltage VFN0. Then row select switch RSW is turned on and the initial image signal is passed through as voltage Vrs_pix0 on node rs_pix. Then reset transistor RST and capacitor control transistor DCG are set low followed by transfer transistor TX1 being set high. Transistor TX1 remains high for a time interval (the exposure time) and then set low. During the exposure time floating drain node FN is charged to a level proportional to the light intensity falling on photodiode PD1 (here called VFN1) which charges the gate electrode of amplifier transistor SF which pulls the source of transistor amplifier SF to an image signal corresponding to VFN1 and, since row select switch RSW remains on, the image signal is passed through as voltage Vrs_pix1 on node rs_pix. Readout circuits not on pixel cell portion 602 (off-pixel) but elsewhere on the image sensor, typically perform correlated double sampling (CDS) on image signals Vrs_pix0 and Vrs_pix1. FIG. 7 illustrates in its bottom row an off-pixel CDS circuit sampling signal rs_pix while reset transistor RST is off and just before and after transfer transistor TX1 is turned on and off. Typically this facilitates image signal Vrs_pix0 being subtracted from image signal Vrs_pix1 to provide a low noise signal to the image sensor related to photodiode PD1. Similarly photodiodes PD2, and PDn may be read out to complete the image signal associated with pixel cell portion 602.

Figure 8:
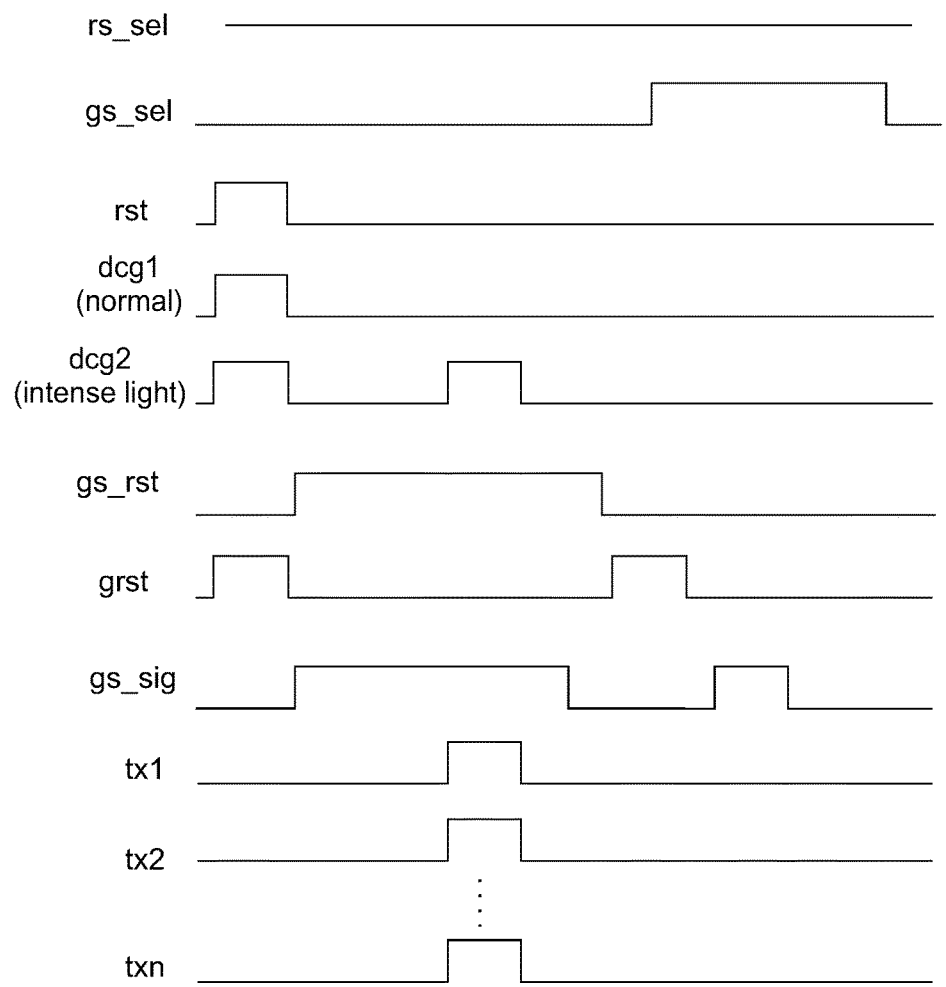
FIG. 8 is a control timing diagram illustrating control signal timing that may be used to execute another selected readout mode of the pixel cell illustrated in FIG. 5 and in accordance with a first embodiment of the invention.

To execute a rolling shutter readout of image signal PIXO from cell portion 602 when a high light intensity scene is to be imaged the following sequence as shown in FIG. 7 may be employed. First all signals are in the off state. Next the reset control signal rst on reset transistor RST and the control signal dcg on capacitor control transistor DCG are set high, which pulls floating drain node FN to an initial voltage VFN0 (close to PIXVDD) and also pulls the source of amplifier SF to an image signal PIXO(rst) corresponding to initial voltage VFN0. Then row select switch RSW is turned on and the initial image signal is passed through as voltage Vrs_pix0 on node rs_pix. Then reset transistor RST and capacitor control transistor DCG are set low. After a short interval capacitor control transistor DCG is once again set high simultaneously with transfer transistor TX1 being set high. Transistor TX1 remains high for a time interval (the exposure time) and then set low. During the exposure time floating drain node FN and dynamic range enhancement capacitor Cdcg are charged to a level proportional to the light intensity falling on photodiode PD1 (here called VFN1) which charges the gate electrode of amplifier transistor SF which pulls the source of transistor amplifier SF to an image signal corresponding to VFN1 and, since row select switch RSW remains on, the image signal is passed through as voltage Vrs_pix1 on node rs_pix. Since the combined capacitance of the floating drain FN and dynamic range enhancement capacitor Cdcg is larger than the capacitance of the floating drain FN alone more charge can be collected before saturation is reached and pixel cell dynamic range is thereby enhanced. Readout circuits not on pixel cell portion 602 (off-pixel) but elsewhere on the image sensor, typically perform correlated double sampling (CDS) on image signals Vrs_pix0 and Vrs_pix1. FIG. 7 illustrates in its bottom row The principle of operation for reading out an image signal from pixel cell portion 602 in a global shutter mode with in-pixel CDS provided by circuits on pixel cell portion 604 consists of two phases, namely: sampling of the reset value and sampling of the signal value. During this second phase (sampling of the signal value), the in-pixel CDS operation occurs automatically due to the inherent nature of the architecture of the circuit elements on pixel cell portion 604. Operationally, in order to read out image signal PIXO in global shutter mode all the transistors on pixel cell portion 604 are operational in order to transfer read signal rs_pix to off-pixel readout circuits. Therefore upon selection of global shutter mode by a suitable setting on state register 110 shown in FIG. 1, control circuitry 108 will cause transistor RSW to be turned off. FIG. 8 illustrates control timing that may be used to execute a global shutter mode readout of image signal PIXO from pixel cell portion 602. Each control signal shown in FIG. 8 corresponds to the similarly named signals applied to the gate electrodes of related transistors shown in FIG. 6 and their relative state of on (high) or off (low) is also shown. To execute a global shutter readout of image signal PIXO from pixel cell portion 602 when imaging a scene of low or normal light intensity the following sequence as shown in FIG. 8 may be employed. First the reset control signal rst on reset transistor RST and the control signal dcg1 on capacitor control transistor DCG are set high, which pulls floating drain node FN to an initial voltage VFN0 (nearly the same as PIXVDD) and also pulls the source of amplifier transistor SF to an image signal PIXO(rst) corresponding to initial voltage VFN0. Then set RST and DCG low while transistors Grst, GS and GS_RST are set high to charge capacitor Crst to voltage V(Crst) where V(Crst)=PIXVDD−PIXO(rst). Then global reset transistor Grst is turned off allowing the top plate of capacitor Crst to float. Then all the transfer transistors TX1, TX2, through TXn are turned on and allowed to remain on for the duration of an exposure time. If the scene being imaged was a high light intensity scene the control signal sequence dcg2 would replace the signal sequence dcg1 thereby turning on capacitor control transistor DCG in unison with the transfer transistors causing an increase in the effective capacitance of the floating node and in the amount of image charge collected before saturation. This action causes the image signal PIXO(sig) to charge dynamic range enhancement capacitor Csig to a level proportional to the light intensity falling on the photodiodes. Global shutter transistor GS is then turned off followed shortly by GS_RST which is turned off to cause image signal PXIO(sig) to remain on capacitor Csig. The sequence of signals described so far accomplish storing the global shutter image signal on to the global shutter capacitors with the in-pixel CDS occurring in the process by the sequential application of the reset and image signals to the capacitors.

In order to read out the image signal from the global shutter capacitors the following additional sequence of steps is required as further illustrated in FIG. 8. Next global reset transistor Grst is turned on to precharge the parasitics in capacitor Crst. While Grst is on and shortly before it is turned off, global shutter row select transistor GSW is turned on to briefly sample the reset signal from amplifier GSF out as signal Vgs_pix0 until global shutter reset transistor Grst is turned off. With global shutter row select transistor GSW remaining on after global shutter reset transistor Grst is turned off the next step is to turn on global shutter transistor GS for a time interval suitable to sample the image signal from amplifier GSF as Vgs_pix1. Row select transistor GSW is then turned off. Readout circuits not on pixel cell portion 604 (off-pixel) but elsewhere on the image sensor, typically perform correlated double sampling (CDS) on image signals Vrs_pix0 and Vrs_pix1. The off-pixel CDS circuit typically samples signal gs_pix while reset transistor Grst is off and just before and after transfer transistor GS is turned on and off. This commonly added operation deals with the noise associated with source follower amplifier transistor GSF.

An optional feature to the readout circuits illustrated in FIG. 6 involves a configuration whereby the rs_out and gs_out signal nodes may be electrically connected together in order to economize on circuit wiring. All other aspects of the described inventions remain unchanged.

Figure 9:
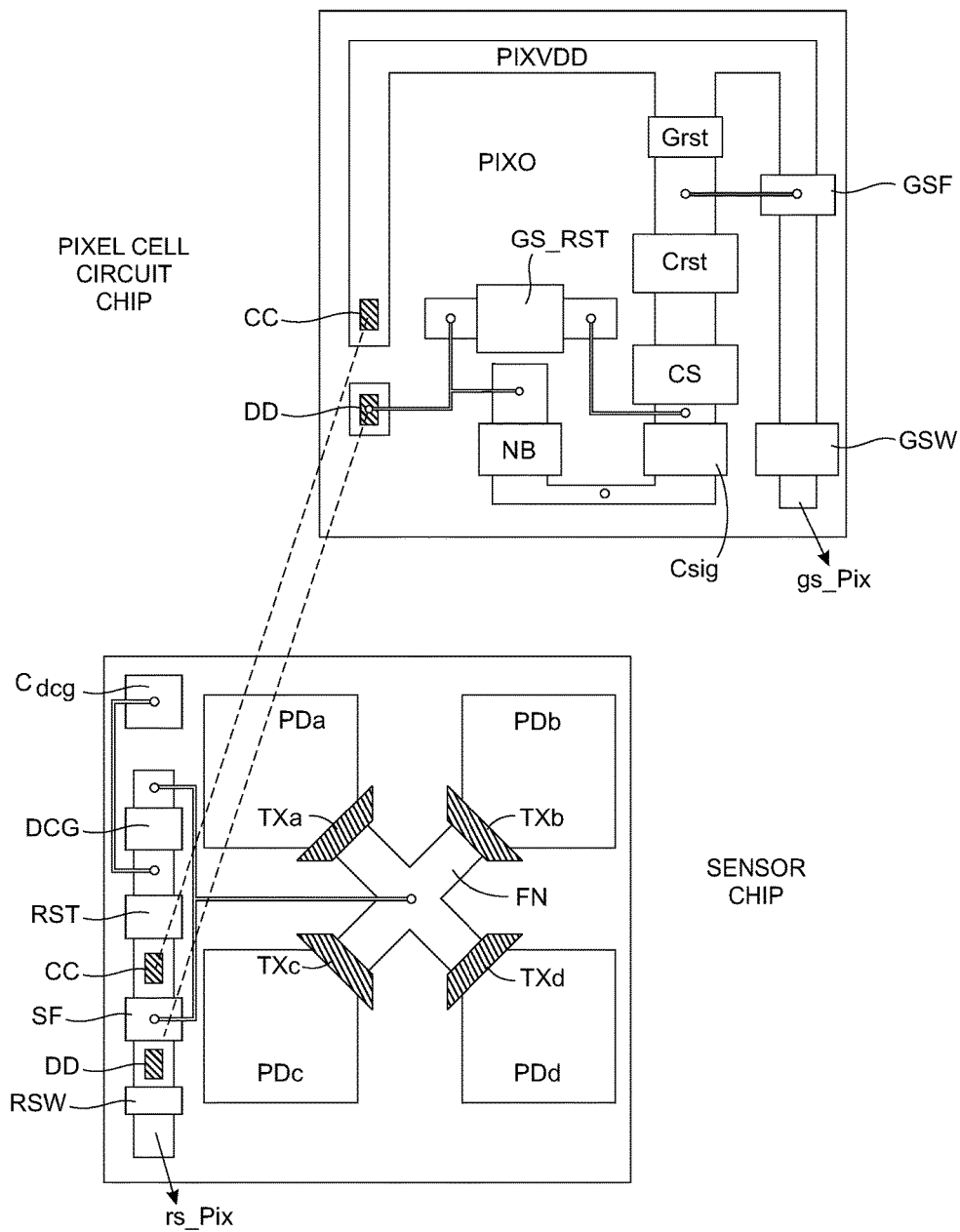
FIG. 9 is an exploded view diagram of a pixel cell in accordance with a second embodiment of the invention.
Figure 10:
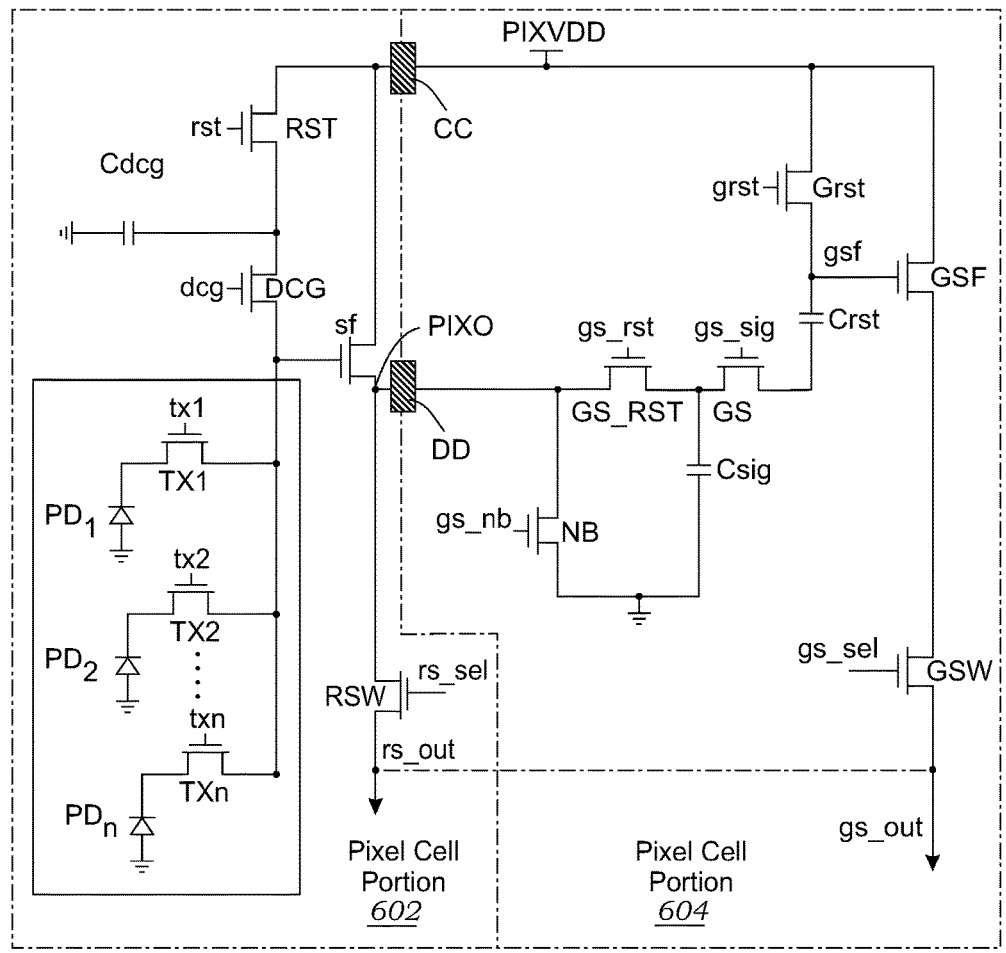
FIG. 10 is an electrical schematic diagram of the pixel cell illustrated in FIG. 9 and in accordance with a second embodiment of the invention.
Figure 11:
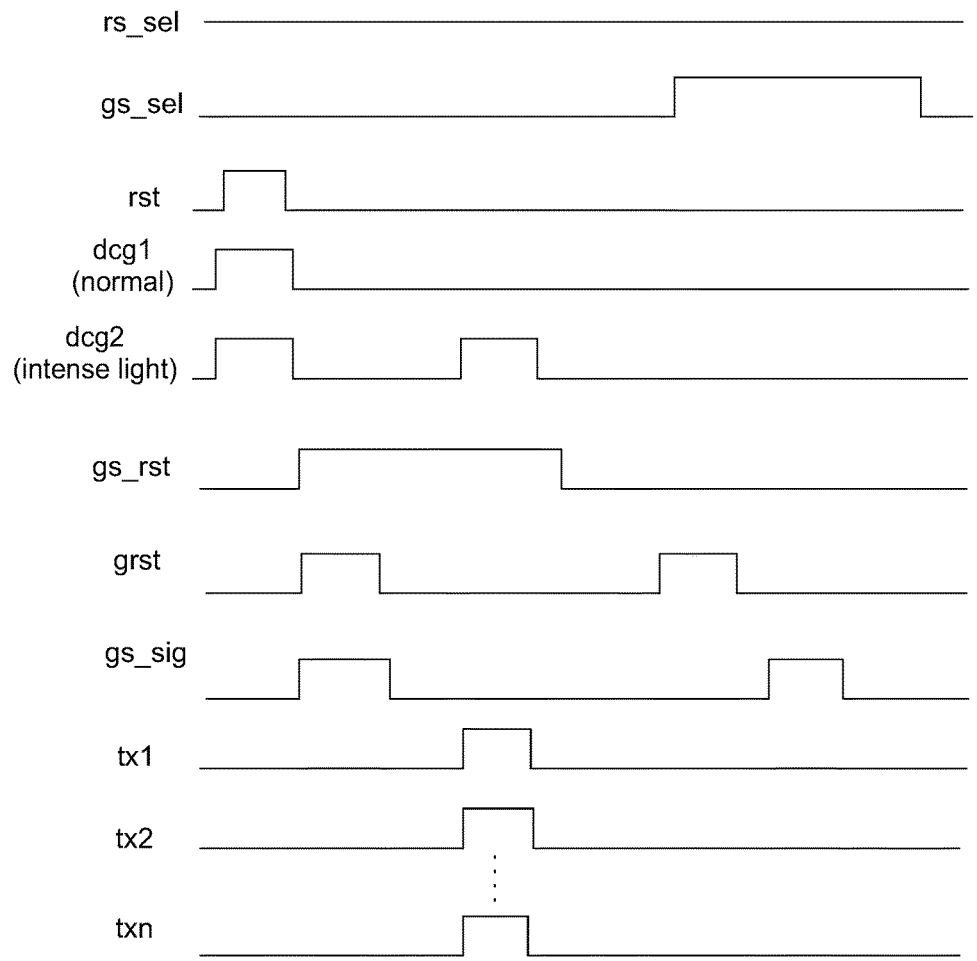
FIG. 11 is a control timing diagram illustrating control signal timing that may be used to execute a selected readout mode of the pixel cell illustrated in FIG. 9 and in accordance with a second embodiment of the invention.

FIG. 9 is an exploded view diagram of a pixel cell in accordance with a second embodiment of the invention wherein the included labels are the same as shown in FIG. 5. FIG. 10 is an electrical schematic diagram of the pixel cell illustrated in FIG. 9. The second embodiment of the invention as illustrated in FIG. 9 and FIG. 10 differs from the first embodiment of the invention as illustrated in FIG. 5 and FIG. 6 by the fact that global shutter switch transistor GS is located between capacitor Crst and Csig instead of as illustrated in FIG. 5 and FIG. 6 where it is between capacitor Csig and the ground terminal. Upon selection of rolling shutter read out mode the image signal is read out as described above for the first embodiment of the invention. Upon selection of the global shutter read out mode the image signal is read out in a manner similar to that described above for the first embodiment except for a few steps as illustrated in FIG. 11 which are readily determined by comparison.

An optional feature to the readout circuits illustrated in FIG. 10 involves a configuration whereby the rs_out and gs_out signal nodes may be electrically connected together in order to economize on circuit wiring. All other aspects of the described inventions remain unchanged.

Reference throughout this specification to "one embodiment," "an embodiment," "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. Directional terminology such as "top", "down", "above", "below" are used with reference to the orientation of the figure(s) being described. Also, the terms "have," "include," "contain," and similar terms are defined to mean "comprising" unless specifically stated otherwise. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

The above description of illustrated examples of the present invention, including what is described in the Abstract, are not intended to be exhaustive or to be limited to the precise forms disclosed. While specific embodiments of, and examples for, the invention are described herein for illustrative purposes, various equivalent modifications are possible without departing from the broader spirit and scope of the present invention. Indeed, it is appreciated that the specific example structures and materials are provided for explanation purposes and that other structures and materials may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. A pixel cell, comprising:
   a first substrate having a front surface and a back surface;
   a set of transfer transistors, each coupled to respective photodiodes and sharing floating drains, disposed within a first substrate for accumulating and transferring an image charge in response to light incident upon the photodiodes;
   a reset transistor, a dynamic range enhancement capacitor, a capacitor control transistor, an amplifier transistor in a source follower configuration and a rolling shutter row select transistor disposed within the first substrate for converting the image charge to an image signal and for coupling it out of the first substrate when a rolling shutter readout mode is selected, wherein the set of transfer transistors and respective photodiodes comprise one or more transistors and one or more associated photodiodes, and wherein all the transfer transistors share a floating drain connected to first terminals of the capacitor control transistor and the gate electrode of the amplifier transistor, and wherein first terminals of the dynamic range enhancement capacitor and of the reset transistor are connected to the second terminal of the capacitor control transistor, and wherein the amplifier transistor drain electrode and the second terminal of the reset transistor are coupled to a power supply;
   a global shutter readout circuit block disposed within a second substrate stacked upon the front surface of the first substrate for coupling out the image signal through the second substrate when a global shutter readout mode is selected, wherein the selectable global shutter mode of the readout circuit block causes the image signal from the amplifier transistor to couple through a global shutter row select transistor to a column line of an image sensor while a rolling shutter row select transistor on the first substrate is turned off, and wherein the global shutter mode of the readout circuit block includes circuit elements coupled between the amplifier transistor and a global shutter output amplifier transistor that are operable to perform correlated double sampling (CDS) on the amplifier transistor and the readout circuit elements, and wherein the global shutter output amplifier transistor drain electrode is connected to a power supply and the global shutter output amplifier transistor gate electrode is coupled through an a global shutter output amplifier transistor reset transistor to the power supply, and wherein between the gate electrode of the global shutter output amplifier and a ground connection there are three components; and an inter-chip electrical interconnect which directly couples the source of the amplifier transistor to the global shutter readout circuit block.

2. The pixel cell of claim 1, wherein the set of transfer transistors and photodiodes comprise four transfer transistors and photodiodes arranged in a two by two block and wherein one of the photodiodes receives incident light through a red filter and one other of the photodiodes receives incident light through a blue filter and two other of the photodiodes receives incident light through green filters.

3. The pixel cell of claim 1, wherein the selected readout mode is determined by the status of a selectable state register setting within an image sensor.

4. The pixel cell of claim 1, wherein the optionally selectable rolling shutter mode causes the image signal from the amplifier transistor to couple through the rolling shutter row select transistor on the first substrate to a column line of an image sensor while the transistors within the readout circuit block on the second substrate are turned off.

5. The pixel cell of claim 1, wherein the three components include firstly a reset capacitor (Crst) coupled between the gate of the global shutter output amplifier transistor and a terminal coupled to the image signal through a global shutter reset transistor and secondly a signal capacitor (Csig) coupled between the terminal and a drain electrode of a third component, a global signal select transistor wherein the source of the global signal select transistor is coupled to the ground connection.

6. The pixel cell of claim 5 wherein the output terminal where the image signal amplifier transistor on the first substrate connects to the global shutter reset transistor is coupled to ground on the second substrate through a global shutter bias current transistor.

7. The pixel cell of claim 1, wherein the three components include firstly a reset capacitor (Crst) coupled between the gate of the global shutter output amplifier transistor and a drain electrode of a second component a global signal select transistor wherein the source of the global signal select transistor is connected to a terminal coupled to the image signal through a global shutter reset transistor and wherein the source of the global signal select transistor is also connected to a third component a signal capacitor (Csig) wherein the signal capacitor is coupled between the terminal and the ground connection.

8. The pixel cell of claim 7 wherein the output terminal where the image signal amplifier transistor on the first substrate connects to the global shutter reset transistor is coupled to ground on the second substrate through a global shutter bias current transistor.

9. An imaging system component of a digital camera, the imaging system comprising:

a plurality of pixel cells arranged in a two-dimensional array, each of the pixel cells comprising: a first substrate having a front surface, and a back surface;

a set of transfer transistors, each coupled to respective photodiodes and sharing floating drains, disposed within a first substrate for accumulating and transferring an image charge in response to light incident upon the photodiodes;

a reset transistor, a dynamic range enhancement capacitor, a capacitor control transistor, an amplifier transistor in a source follower configuration and a rolling shutter row select transistor disposed within the first substrate for converting the image charge to an image signal and for coupling it out of the first substrate when a rolling shutter readout mode is selected, wherein the set of transfer transistors and respective photodiodes comprises one or more transistors and one or more associated photodiodes, and wherein all the transfer transistors share a floating drain connected to first terminals of the capacitor control transistor and the gate electrode of the amplifier transistor, and wherein first terminals of the dynamic range enhancement capacitor and of the reset transistor are connected to the second terminal of the capacitor control transistor and wherein the amplifier transistor drain electrode and the second terminal of the reset transistor are coupled to a power supply;

a global shutter readout circuit block disposed within a second substrate stacked upon the front surface of the first substrate for coupling out the image signal through the second substrate when a global shutter readout mode is selected, wherein the selectable global shutter mode of the readout circuit block causes the image signal from the amplifier transistor to couple through a global shutter row select transistor to a column line of an image sensor while a rolling shutter row select transistor on the first substrate is turned off, and wherein the global shutter mode of the readout circuit block includes circuit elements coupled between the amplifier transistor and a global shutter output amplifier transistor that are operable to perform correlated double sampling (CDS) on the amplifier transistor and the readout circuit elements, and wherein the global shutter output amplifier transistor drain electrode is connected to a power supply and the global shutter output amplifier transistor gate electrode is coupled through an a global shutter output amplifier transistor reset transistor to the power supply, and wherein between the gate electrode of the global shutter output amplifier and a ground connection there are three components; and an inter-chip electrical interconnect which directly couples the source of the amplifier transistor to the global shutter readout circuit block.

* * * * *